United States Patent
Chang et al.

[11] Patent Number: 6,130,146
[45] Date of Patent: Oct. 10, 2000

[54] IN-SITU NITRIDE AND OXYNITRIDE DEPOSITION PROCESS IN THE SAME CHAMBER

[75] Inventors: Jung-Ho Chang, Uen-Lin; Hsi-Chuan Chen, Tainan; Dahcheng Lin, Hsinchu, all of Taiwan

[73] Assignee: Vanguard International Semiconductor Corporation, Hsin-Chu, Taiwan

[21] Appl. No.: 09/359,893

[22] Filed: Jul. 26, 1999

[51] Int. Cl.[7] .................................................. H01L 21/3205
[52] U.S. Cl. ........................ 438/592; 438/595; 438/671; 438/763; 438/786; 438/791; 438/952
[58] Field of Search ..................... 438/585, 592, 438/595, 655, 656, 657, 671, 761, 763, 778, 786, 791, 952

[56] References Cited

U.S. PATENT DOCUMENTS

| | | | |
|---|---|---|---|
| 5,478,765 | 12/1995 | Kwong et al. | 437/40 |
| 5,523,255 | 6/1996 | Hyung et al. | 437/69 |
| 5,856,225 | 1/1999 | Lee et al. | 438/592 |
| 5,883,011 | 3/1999 | Lin et al. | 438/747 |
| 5,920,796 | 7/1999 | Wang et al. | 438/700 |
| 5,960,289 | 9/1999 | Tsui et al. | 438/275 |
| 5,963,841 | 10/1999 | Karlsson et al. | 438/952 |
| 6,004,853 | 12/1999 | Yang et al. | 438/592 |
| 6,022,776 | 2/2000 | Lien et al. | 438/253 |
| 6,027,959 | 2/2000 | En et al. | 438/142 |
| 6,037,266 | 3/2000 | Tao et al. | 438/719 |
| 6,037,276 | 3/2000 | Lin et al. | 438/786 |

*Primary Examiner*—John F. Niebling
*Assistant Examiner*—Lynne A. Gurley
*Attorney, Agent, or Firm*—George O. Saile; Stephen B. Ackerman; William J. Stoffel

[57] ABSTRACT

A method for insitu forming a SiN layer and an overlying Silicon oxynitride layer in one chamber. A substrate is loaded into a chamber. The substrate has thereover a polysilicon layer and a overlying metal layer. In a first in-situ step, a nitride layer is deposited using a LPCVD process over the substrate. The nitride layer is preferably formed at a temperature between 650 and 800° C. and flowing $SiH_2Cl_2$ and $NH_3$. In a second in-situ step, an oxynitride layer is deposited over the nitride layer. The oxynitride layer acts as a bottom anti-reflective coating (BARC). The oxynitride (SiON) layer can be formed by a LPCVD process. Second, the LPCVD oxynitride can be formed a temperature between 600 and 800° C. with a $SiH_4$ flow and a $N_2O$ flow. The substrate is removed from the chamber. A photoresist layer is formed over the oxynitride layer. The photoresist layer is exposed using the oxynitride layer as a bottom anti-reflective coating (BARC). The photoresist layer is developed. The oxynitride layer, the nitride layer, the metal layer and the polysilicon layer are etched to form a gate structure. The gate structure has sidewalls. Spacers are formed on the sidewalls of the gate structure. An ILD layer is formed over the gate structure. A contact hole is etched through the ILD layer using the gate structures and spacers as a mask to expose the substrate to form a self aligned contact (SAC) opening.

14 Claims, 2 Drawing Sheets

IN-SITU NITRIDE AND OXYNITRIDE DEPOSITION PROCESS IN THE SAME CHAMBER

BACKGROUND OF INVENTION

1) Field of the Invention

This invention relates generally to fabrication of nitride and oxynitride film for semiconductor devices and more particularly to the fabrication of a silicon nitride layer and an oxynitride layer used a bottom anti-reflective coating (BARC) for fabrication semiconductor devices.

2) Description of the Prior Art

As technology scaled down to 0.25 μm or below, the photolithography is pushed to deep UV generation. The reflection of the incident light from the photoresist-substrate interface increases, leading to a severe line width fluctuation as the resist thickness varies with topography and also the notching in normally unexposed areas by the reflected light.

Various methods have been explored to reduce the light reflections. Bottom anti-reflective coating (BARC) appears to be the most practical approach. Many BARC layer are organic layers that are spun on. However, the organic BARC layers increase the cost significantly and cause following etching process stringent. Improved processes must be developed better form BARC layers to are less complex to manufacture.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,523,255(Hyung) shows a method for forming a Silicon oxynitride layer for a LOCOS process. U.S. Pat. No. 5,478,765(Kwong et al.) shows process for forming a Silicon oxynitride layer. Therefore, there is a need for improved processes to better form BARC layers that are less complex to manufacture.

SUMMARY OF THE INVENTION

It is an object of the present invention to provide a method for fabricating in-situ a nitride layer and an overlying BARC Silicon oxynitride (SiON) layer.

It is an object of the present invention to provide a method for fabricating in-situ a nitride layer and an overlying BARC Silicon oxynitride (SiON) layer used to pattern a gate.

It is an object of the present invention to provide a method for fabricating in-situ a nitride layer and an overlying BARC Silicon oxynitride (SiON) layer used in a self aligned contact (SAC) process.

To accomplish the above objectives, the present invention provides a method for insitu forming a SiN layer and an overlying Silicon oxynitride layer. In this invention, a new process is described to deposit nitride and oxynitride films in one step in the same chamber. With this process, the process time and cost will be far less than a conventional two reactor deposition process or the organic BARC process.

The method includes the following. A substrate 10 is loaded into a chamber. The substrate 10 preferably has thereover a polysilicon layer 14 and an overlying metal layer 18.

In a first step, a nitride layer 22 is deposited using a LPCVD process over the substrate. The nitride layer is preferably formed at a temperature between 650 and 800° C. and flowing $SiH_2Cl_2$ and $NH_3$ or $SiH_4$ and $NH_3$.

In a second step, still in the same chamber, an oxynitride layer 26 is deposited over the nitride layer. The oxynitride layer acts as a bottom anti-reflective coating (BARC).

The oxynitride layer can be formed by a PECVD, LPCVD or a Thermal process. First, the LPCVD oxynitride layer is formed a temperature between 600 and 800° C. at a $SiH_4$ and a $N_2O$ flow.

The substrate 10 is then removed from the chamber. A photoresist layer is formed over the oxynitride layer. The photoresist layer is exposed using the oxynitride layer as a bottom anti-reflective coating (BARC). The photoresist layer is developed. The oxynitride layer, the nitride layer, the metal layer and the polysilicon layer are etched to form a gate structure. The gate structure has sidewalls. Spacers are formed on the sidewalls of the gate structure. An interlevel dielectric layer is formed over the gate structure. A contact hole is etched through the ILD layer using the gate structures and spacers as a mask to expose the substrate to form a self aligned contact (SAC) opening.

In this invention, a process is described to deposit nitride and oxynitride films in one step in the same chamber. With this process, the process time and cost will be far less than a two chamber deposition process.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention. Also, the flow rates in the specification can be scaled up or down keeping the same molar % or ratios to accommodate difference sized reactors as is known to those skilled in the art. Also, other deposition parameters, such as power, can also be proportionally scaled.

Problem the Invention Overcomes

The inventors have found that the sequential steps of a nitride deposition and a oxynitride deposition is becoming more common in their future technology. In a process know by the inventors a, nitride film is deposited in LPCVD system by $SiH_2Cl_2$ and $NH_3$ and the anti-reflective oxynitride film is developed by plasma enhanced chemical vapor deposition technique or thermal deposition method using $SiH_4$ and $N_2O$ in different equipment or chambers. In addition to wasting time in wafer transfer from nitride deposition equipment to oxynitride deposition equipment, this will also make the process more complex. The precleaning required between these two deposition process and the sustenance of the two equipment or chambers will be more complex.

Invention-In-situ 2 step SiN and SiON BARC Deposition

In this invention, a new process is developed to integrate nitride deposition and oxynitride deposition in one deposition chamber or reactor (e.g., insitu). The invention can be used in a chamber capable of depositing LPCVD SiN and LPCVD SiON. The nitride is deposited, by $SiH_2Cl_2$ (or $SiH_4$) and $NH_3$ at 650° C. to 800° C. After nitride deposition, the anti-reflective coating-oxynitride is in-situ deposited by SiH4 and $N_2O$ at about 600° C. to 850° C. in the same LPCVD chamber. After oxynitride deposition, the wafer is taken out for photoresist (PR) coating, and patterning for the following process.

With this process, the nitride film and anti-reflective coating oxynitride is formed in one step, which saves the process time and cost than a two chamber deposition process.

The invention begins by loading a substrate 10 into a chamber. The chamber can be a LPCVD furnace or a single wafer CVD deposition chamber. The substrate 10 preferably has thereover a polysilicon layer 14 and a overlying metal layer 18.

The metal layer is preferably composed of tungsten silicide, titanium silicide.

First Step-In-Situ Silicon Nitride Layer 22 LPCVD Deposition

Figure 4:
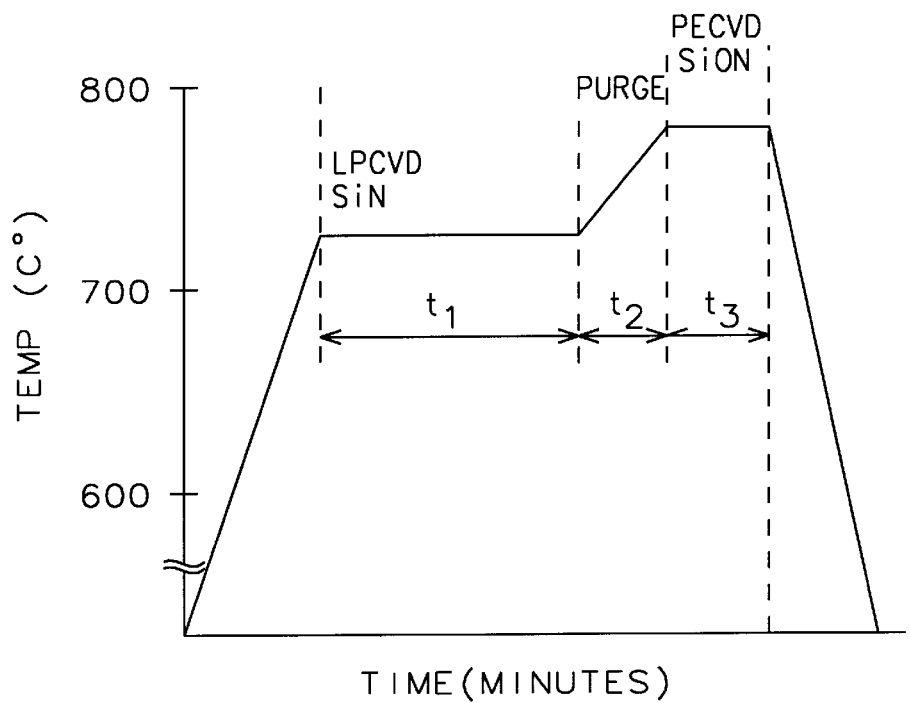
FIG. 4 is graph of the invention's an in-situ process or forming in-situ a SiN layer and a BARC SiON layer.

FIG. 4 shows a graph of the invention's insitu 2 step nitride/BARC SiON layer deposition.

In a first step, a nitride layer 22 is deposited using a LPCVD process over the substrate.

The nitride layer is formed at a temperature between 650 and 800° C. and flowing $SiH_2Cl_2$ and a $NH_3$ flow. The nitride layer preferably has a thickness of between about 1500 and 2500 Å (tgt=2000 Å).

After the nitride deposition step 1, the reactor is preferably purged in an inert gas as the chamber ramps up to between about 700 to 850° C. and more preferably about 775+/−, 5° C. See FIG. 4.

Second Step-Insitu Silicon Oxynitride Layer (LPCVD) Deposition

In a second step, an oxynitride layer 26 is deposited over the nitride layer. The oxynitride layer preferably acts as a bottom anti-reflective coating (BARC). The oxynitride layer has a thickness of between about 200 and 800 Å.

The Oxynitride can be formed by two processes: LPCVD (Thermal) or PECVD and is most preferably formed by a LPCVD (also called a thermal process).

The substrate 10 is then removed from the chamber.

Self Aligned Contact (SAC) Process

Figure 1:
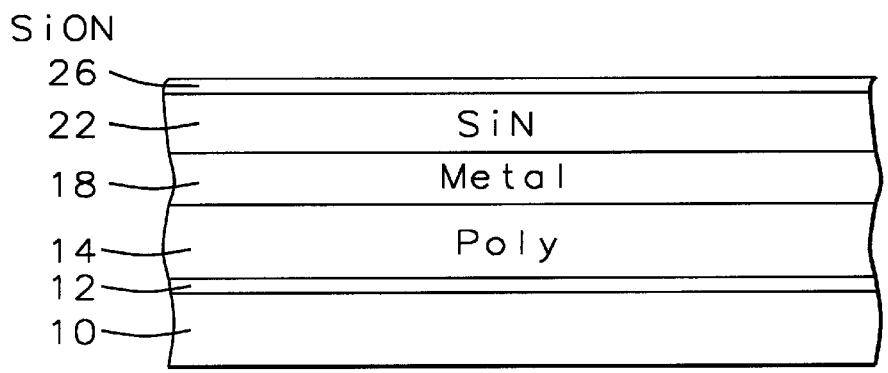
FIGS. 1, 2 and 3 are cross sectional views for illustrating a method for forming in-situ a SiN layer and a BARC SiON layer according to the present invention.
Figure 2:
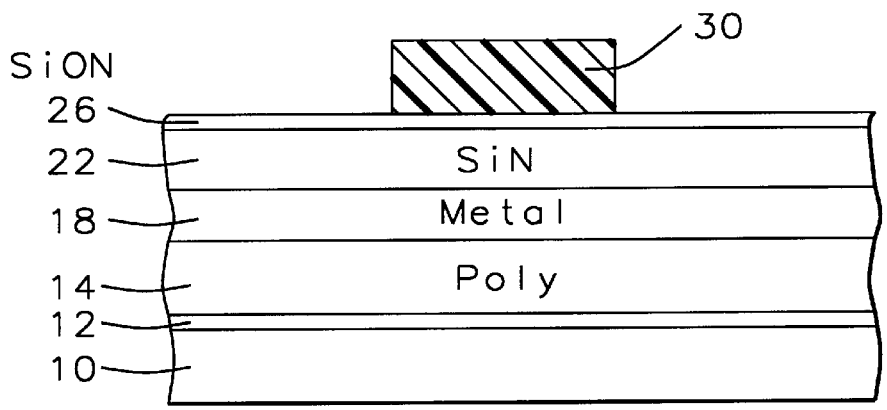

As shown in FIG. 2, a photoresist layer 30 is formed over the oxynitride layer.

The photoresist layer is exposed using the oxynitride layer as a bottom anti-reflective coating (BARC). The photoresist layer is developed.

Figure 3:
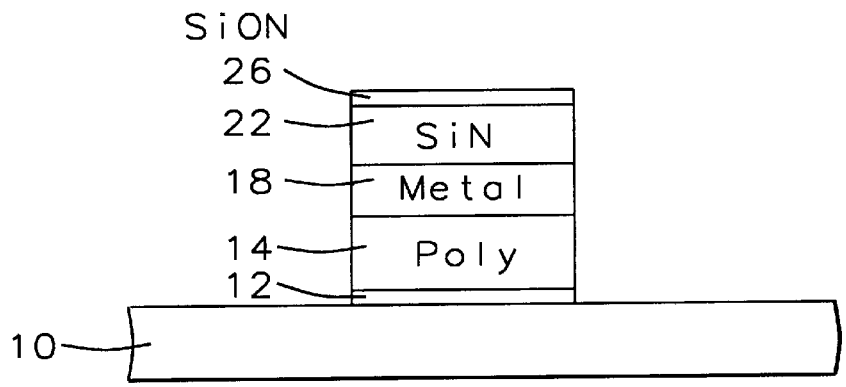

The oxynitride layer 26, the nitride layer 22, the metal layer 18 and the polysilicon layer 14 are etched to form a gate structure 26 22 18 14 as shown in FIG. 3. The gate structure has sidewalls. The photoresist layer 30 is removed.

Figure 5:
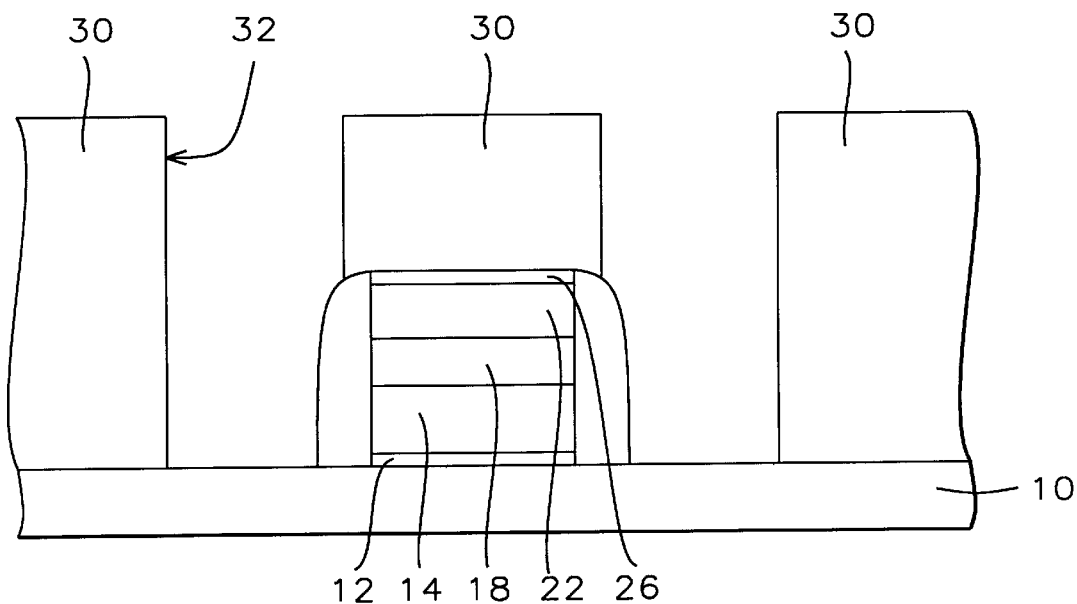
FIG. 5 is a cross sectional view for illustrating an embodiment of the invention where a self aligned contact (SAC) is formed.

As shown in FIG. 5, spacers 26 are formed on the sidewalls of the gate structure.

An interlevel dielectric (ILD) layer 30 is formed over the gate structure.

A contact hole 32 is etched through the ILD layer using the gate structures and spacers as a mask to expose the substrate to form a self aligned contact (SAC) opening.

The contact hole is then filled with a conductive material (not shown), such as W or Cu, to form a contact to the substrate.

It should be recognized that many publications describe the details of common techniques used in the fabrication process of integrated circuit components. Those techniques can be generally employed in the fabrication of the structure of the present invention. Moreover, the individual steps of such a process can be performed using commercially available integrated circuit fabrication machines. As specifically necessary to an understanding of the present invention, exemplary technical data are set forth based upon current technology. Future, developments in the art may call for appropriate adjustments as would be obvious to one skilled in the art.

While the invention has been particularly shown and described with reference to the preferred embodiments thereof, it will be understood by those skilled in the at that various changes in form and details may be made without departing from the spirit and scope of the invention.

What is claimed is:

1. A method of fabricating a nitride layer and an overlying Silicon oxynitride layer in one chamber comprising the steps of:

a) loading a substrate into said chamber;

b) in a first step, depositing a nitride layer using a LPCVD process over said substrate;

c) in a second step, in-situ depositing an oxynitride layer over said nitride layer; said oxynitride layer formed using a low pressure chemical vapor deposition (LPCVD) process, said oxynitride layer acting as a bottom anti-reflective coating (BARC);

d) removing said substrate from said chamber.

2. The method of claim 1 wherein said substrate has thereover a polysilicon layer and an overlying metal layer; said metal layer is composed of a material selected from the group consisting of tungsten silicide, and titanium silicide.

3. The method of claim 1 wherein said nitride layer formed at a temperature between 650 and 800° C. and $SiH_2Cl_2$ and a $NH_3$ flow.

4. The method of claim 1 wherein said nitride layer has a thickness of between about 1500 and 2500 Å.

5. The method of claim 1 wherein said oxynitride layer has a thickness of between about 200 and 800 Å.

6. The method of claim 1 wherein said oxynitride layer formed using a LPCVD process at a temperature between 600 and 800° C. at a $SiH_4$ flow and a $N_2O$ flow.

7. The method of claim 1 wherein said oxynitride layer has a thickness between about 200 and 800 Å.

8. The method of claim 1 which further includes:

a) forming a photoresist layer over said oxynitride layer;

b) exposing said photoresist layer using said oxynitride layer as a bottom anti-reflective coating (BARC) and developing said photoresist layer;

c) etching said oxynitride layer, said nitride layer, said metal layer and said polysilicon layer to form a gate structure; said gate structure having sidewalls;

d) forming spacers said sidewalls of said gate structure;

e) forming an interlevel dielectric layer over said gate structure;

f) etching a contact hole through said interlevel dielectric layer using said gate structures and spacers as a mask to expose said substrate to form a self aligned contact (SAC) opening.

9. A method of fabricating a nitride layer and an overlying Silicon oxynitride layer in one chamber comprising the steps of:

a) loading a substrate into said chamber; said substrate having thereover a polysilicon layer and an overlying metal layer; said metal layer is composed of tungsten silicide or titanium silicide;

b) in a first step, depositing a nitride layer using a LPCVD process over said substrate; said nitride layer formed at a temperature between 650 and 800° C. and with a $SiH_2Cl_2$ flow; and a $NH_3$ flow;

c) in a second step, in-situ depositing an oxynitride layer over said nitride layer; said to oxynitride layer acting as a bottom anti-reflective coating (BARC); said oxynitride formed using a LPCVD process; said oxynitride layer formed a temperature between 600 and 800° C. with a $SiH_4$ flow and a $N_2O$ flow;

d) removing said substrate from said chamber.

10. The method of claim 9 which further includes:

a) forming a photoresist layer over said oxynitride layer;

b) exposing said photoresist layer using said oxynitride layer as a bottom anti-reflective coating (BARC) and developing said photoresist layer;

c) etching said oxynitride layer, said nitride layer, said metal layer and said polysilicon layer to form a gate structure; said gate structure having sidewalls;

d) forming spacers said sidewalls of said gate structure;

e) forming an interlevel dielectric layer over said gate structure;

f) etching a contact hole through said interlevel dielectric layer using said gate structures and spacers as a mask to expose said substrate to form a self aligned contact (SAC) opening.

11. The method of claim 9 wherein said nitride layer has a thickness of between about 1500 and 2500 Å.

12. The method of claim 9 wherein said oxynitride layer has a thickness of between about 200 and 800 Å.

13. The method of claim 9 wherein said oxynitride layer acts as an antireflective layer and thickness between about 200 and 800 Å.

14. A method of fabricating a nitride layer and an overlying Silicon oxynitride layer in one chamber comprising the steps of:

a) loading a substrate into said chamber; said substrate having thereover a polysilicon layer and a overlying metal layer; said metal layer is composed of tungsten silicide, or titanium silicide;

b) in a first step, depositing a nitride layer using a LPCVD process over said substrate; said nitride layer formed at a temperature between 650 and 800° C. and a $SiH_2Cl_2$ flow and a $NH_3$ flow; said nitride layer has a thickness of between about 1500 and 2500 Å;

c) in a second step, in-situ depositing an oxynitride layer over said nitride layer; said oxynitride layer acting as a bottom anti-reflective coating MARC); said oxynitride layer has a thickness of between about 200 and 800 Å, said oxynitride layer is formed a temperature between 600 and 800° C. with a $SiH_4$ flow and a $N_2O$ flow; said oxynitride formed using a LPCVD process; and thickness between about 200 and 800 Å;

d) removing said substrate from said chamber;

e) forming a photoresist layer over said oxynitride layer;

f) exposing said photoresist layer using said oxynitride layer as a bottom anti-reflective coating (BARC) and developing said photoresist layer;

g) etching said oxynitride layer, said nitride layer, said metal layer and said polysilicon layer to form a gate structure; said gate structure having sidewalls;

h) forming spacers said sidewalls of said gate structure;

i) forming an interlevel dielectric layer over said gate structure;

j) etching a contact hole through said interlevel dielectric layer using said gate structures and spacers as a mask to expose said substrate to form a self aligned contact (SAC) opening.

* * * * *